United States Patent [19]

Jain et al.

[11] Patent Number: 4,714,901
[45] Date of Patent: Dec. 22, 1987

[54] TEMPERATURE COMPENSATED COMPLEMENTARY METAL-INSULATOR-SEMICONDUCTOR OSCILLATOR

[75] Inventors: Babu L. Jain; Pardeep K. Jain, both of Santa Clara; Michael S. Briner, San Jose, all of Calif.

[73] Assignee: Gould Inc., Rolling Meadows, Ill.

[21] Appl. No.: 787,813

[22] Filed: Oct. 15, 1985

[51] Int. Cl.$^4$ .......................... G05F 3/24; G05F 3/26; H02J 1/04; H03K 3/354
[52] U.S. Cl. .................................. 331/176; 307/491; 307/501; 307/297; 307/310; 323/315; 331/111; 331/186
[58] Field of Search ...................... 331/111, 176, 186; 307/491, 501, 297, 304, 310; 323/312, 315

[56] References Cited

U.S. PATENT DOCUMENTS 4,015,219  3/1977  Kawagoe et al. .............. 331/176 X

FOREIGN PATENT DOCUMENTS 58-172065  8/1983  Japan .................................. 331/176
2071953   9/1981  United Kingdom ................ 323/315

Primary Examiner—Siegfried H. Grimm
Attorney, Agent, or Firm—Edward E. Sachs; G. Paul Edgell; Robert J. Fox

[57] ABSTRACT

A temperature compensated complementary metal-insulator-semiconductor oscillator receives a temperature independent reference voltage from an external source. The temperature independent reference voltage is attenuated and summed with a threshold voltage in order to bias a gate electrode of MOSFET. A bipolar p-n junction diode is connected to the MOSFET at a source electrode in order to bias the MOSFET with a temperature dependent forward voltage drop to compensate for temperature variations therein. The MOSFET controls a temperature independent current. A current mirror assembly receives the current and controls a Schmitt trigger oscillator. The Schmitt trigger oscillator generates a signal having a temperature independent constant period.

19 Claims, 1 Drawing Figure

TEMPERATURE COMPENSATED COMPLEMENTARY METAL-INSULATOR-SEMICONDUCTOR OSCILLATOR

BACKGROUND OF THE INVENTION

The invention relates generally to a monolithic integrated circuit complementary metal-insulatorsemiconductor oscillator circuit having a temperature compensated current source.

One of the problems often associated with the use of integrated circuit metal-insulator-semiconductor oscillators and particularly those embodying metaloxide-semiconductor field effect transistors (MOSFETs) lies in the fact that such oscillators are often unstable, with their period of oscillation being variable as the ambient temperature to which they are exposed changes. Several attempts have been made by those skilled in the art to solve the problem of temperature induced oscillator instability. One such solution has been achieved by using external resistive and capacitive components, connected to the pins of an integrated circuit package. This solution is inconvenient for the user of the integrated circuit in that such external components occupy additional space on a printed circuit board which is almost always at a premium. In addition, the use of external components increases the cost of a particular electronic circuit to the ultimate user. Other workers in the art have attempted to use ring oscillators or Schmitt trigger oscillators to achieve temperature stable oscillation periods. These attempts have, for the most part, been unsuccessful. A solution was proposed in the IEEE Journal of Solid State Circuits, Vol. SC-18, October, 1983 at pages 525–532 in an article entitled: "CONTROL LOGIC AND CELL DESIGN FOR A 4K NVRAM". Although the disclosed NMOS circuit did have a temperature compensation means, unlike the previously mentioned ring oscillator and Schmitt oscillator, it embodied a depletion mode field effect transistor, which would require additional process steps for fabrication as part of a CMOS integrated circuit.

A temperature compensated CMOS oscillator would be particularly useful as a temperature independent clock to generate timing signals for use in memory circuits such as electrically erasable programmable read only memories (EEPROM) and in particular for generating signals required by such circuits for any ERASE or WRITE operations.

What is needed is a temperature stable CMOS oscillator having all of its components implemented on a single integrated circuit die, so that a user of such an integrated circuit would not have to perform any additional engineering for or add any additional components to such a circuit.

SUMMARY OF THE INVENTION

A temperature compensated metal-insulator-semiconductor oscillator formed on an integrated circuit die is disclosed herein. The temperature compensated oscillator includes a voltage divider adapted to receive a temperature stable voltage and generate a temperature stable attenuated reference voltage therefrom. A first current mirror connected to the voltage divider has a current flowing through a sensing leg thereof controlled by the temperature stable reference voltage and produces a first mirror current of approximately one microampere. A first n-channel MOSFET has a first source electrode, a first drain electrode and a first gate electrode with the first source electrode biased at the temperature stable attenuated voltage. The first gate and the first drain electrodes are connected together and receive the one microampere first mirror current in order to generate a bias voltage equal to the sum of temperature stable attenuated voltage and a typical threshold voltage for an n-channel MOSFET on the integrated circuit die in order to offset the effect of threshold voltage in later stages of the circuit.

The bias voltage is fed to a second n-channel MOSFET having a second source electrode, a second gate electrode and a second drain electrode. The second source electrode of the second n-channel MOSFET is biased above ground potential by a forward voltage drop $V_f$ of a bipolar diode. The forward voltage drop decreases as the temperature of the integrated circuit die increases in order to compensate for temperature variations in the second n-channel MOSFET. The voltage across the second gate electrode and the second source electrode of the second n-channel MOSFET can be expressed as:

$$V_{gs} = V_o + V_T - V_f$$

From that expression the current flowing between the second drain electrode and the second source electrode of the second n-channel MOSFET $I_{ds}$ can be expressed as:

$$I_{ds} = (W/2L)C_{ox}(V_o - V_f)^2 \times \mu$$

where W equals the width of the MOSFET channel, L equals the length of the MOSFET channel and $C_{ox}$ is the gate oxide capacitance per unit area. Thus as the charge carrier mobility $\mu$ decreases with increasing temperature, the forward voltage drop term $V_f$ also decreases, thereby providing a temperature independent constant current $I_{ds}$ through the second n-channel MOSFET.

A second current mirror comprised of a sensing leg and two mirror legs senses the temperature independent compensated current and generates in the first mirror leg a first temperature compensated charging current which is linearly proportional thereto. The second leg of the second current mirror assembly is connected to a sensing leg of a third current mirror. The third current mirror sinks a temperature compensated discharge current which is linearly proportional to the temperature independent constant current. In the instant embodiment the charging and the discharging currents are equal.

A Schmitt trigger oscillator having a charging gate and a discharging gate connected thereto senses a voltage across a capacitor which is periodically charged and discharged by the temperature compensated charging and discharging currents. Since the timing capacitor is charged and discharged at constant rates by the current mirrors the Schmitt trigger oscillator has a constant period with respect to temperature.

A principal object of the present invention is to provide a temperature compensated metal-insulator-semiconductor oscillator whereby a temperature compensated current is developed therein without using any off chip components.

It is a further object of the instant invention to provide a temperature compensated metal-insulator-semiconductor oscillator wherein both a charging current and a discharging current which are supplied to a timing capacitor are equal and are temperature compensated.

It is still another object of the present invention to provide a temperature compensated metal-insulator-semiconductor oscillator having all of its components on a single integrated circuit die and being particularly adapted to supply a temperature stable oscillator signal to other portions of said integrated circuit die.

Other objects and uses of the present invention will become obvious to one skilled in the art upon a perusal of the following specification and claims in light of the accompanying drawing.

DESCRIPTION OF THE PREFERRED EMBODIMENT

Figure 1:
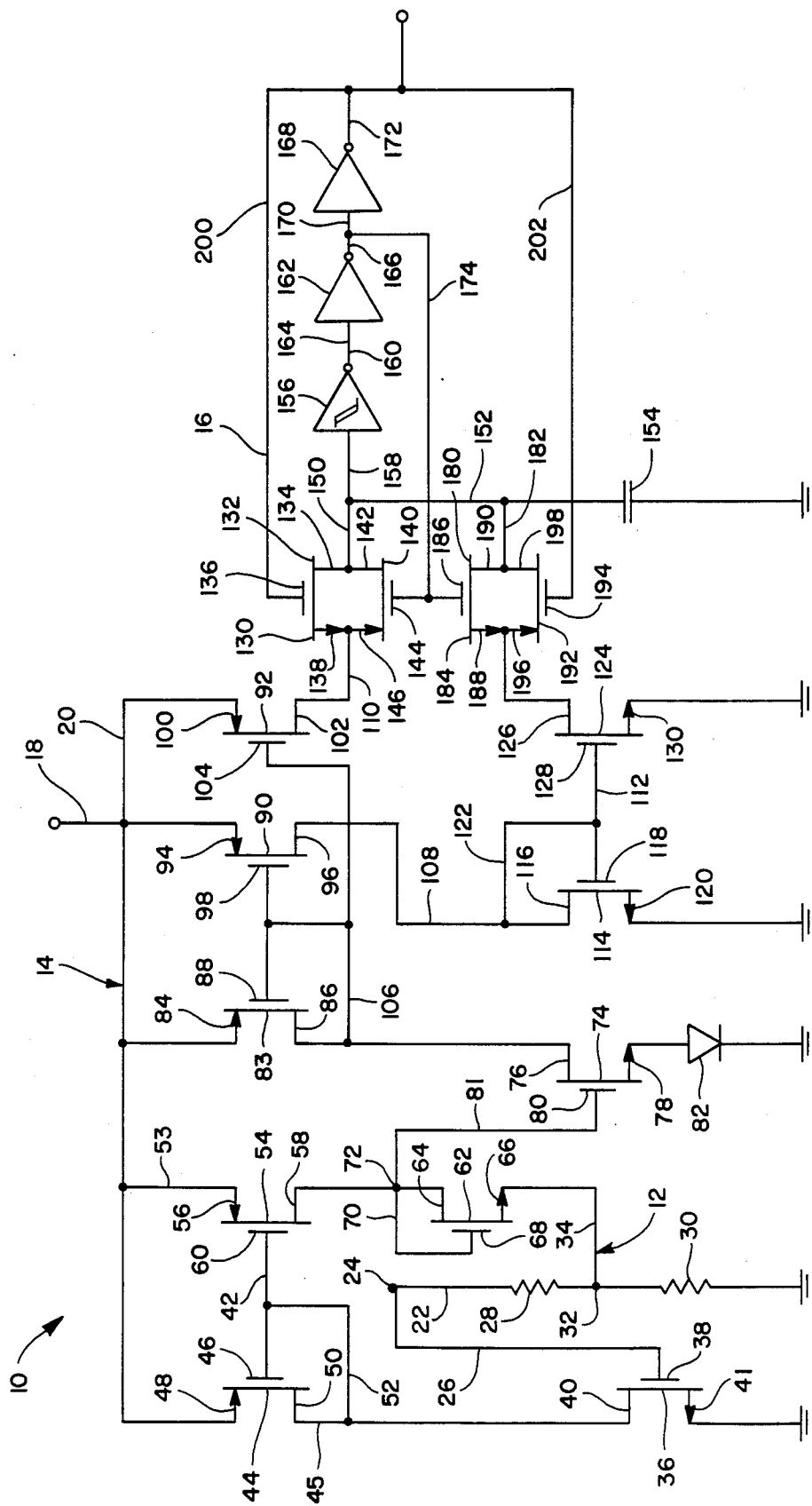
FIG. 1 is a schematic diagram of a temperature compensated metal-insulator-semiconductor oscillator embodying the present invention.

Referring now to FIG. 1, the sole drawing figure, a temperature compensated metal-insulator-semiconductor oscillator, generally indicated by numeral 10 and embodying the present invention, is shown therein. More particularly, the circuit 10 comprises a temperature compensated complementary metal-oxidesemiconductor (CMOS) oscillator. The temperature compensated CMOS oscillator 10 may be preferably formed on a silicon semiconductor die as a monolithic integrated circuit. It should be appreciated that for purposes of interpretation of this disclosure and the accompanying claims the terms, CMOS, MOSFET and the like, refer both to metal-oxide-semiconductor field effect transistor devices as well as to devices which embody polycrystalline silicon, metal silicides or other good conductors as gate electrodes of field effect transistors. The temperature compensated CMOS oscillator 10 includes a temperature compensated current generator 12 which produces a temperature compensated current. A current mirror array 14 receives the temperature compensated current and sources or sinks a plurality of linearly related currents, including a charging current and a discharging current. A Schmitt trigger oscillator 16 is connected to the current mirror array 14 for receipt of the charging current therefrom and supply of the discharging current thereto. The charging current and the discharging current cause the Schmitt trigger oscillator 16 to generate a square wave signal having a period which is substantially independent of temperature.

The temperature compensated CMOS oscillator 10 includes a $V_{DD}$ lead 18 which is connected to an external source of DC voltage. The $V_{DD}$ lead 18 supplies the DC voltage to a bus 20 which is connected thereto. A voltage divider 22 receives a temperature stable reference voltage $V_{ref}$ from a suitable source at a node 24 and supplies the temperature stable reference voltage $V_{ref}$ to an output lead 26. The voltage divider 22 includes a 19.5 kilohm resistor 28 connected to the node 24 and a 20 kilohm resistor 30 connected between the resistor 28 and ground. An attenuated voltage reference signal $V_o$ is generated at a node 32 located at the point at which the resistors 28 and 30 are joined. The $V_o$ potential is supplied to a lead 34 for purposes which will become apparent hereafter. The two resistors are implemented by n well diffusions. N well diffusion processes are well known to those skilled in the art. The lead 26, which is energized at the temperature stable reference voltage $V_{ref}$, is connected to an n-channel enhancement mode MOSFET 36 at a gate electrode 38. The MOSFET 36 also has a drain electrode 40 and a source electrode 41. The source electrode 41 is connected to ground, the drain electrode 40 is connected to a first current mirror 42. The first current mirror 42 is also connected to the bus 20 for energization thereby.

IThe first current mirror 42 includes a p-channel enhancement mode MOSFET 44, having a gate electrode 46, a source electrode 48 and a drain electrode 50. The drain electrode 50 is connected to the drain electrode 40 of the n-channel MOSFET 36. The drain electrode 50 is also connected to the gate electrode 46 by a lead 52, as is conventional with current mirrors. The p-channel MOSFET 44 comprises a sensing leg 45 of the current mirror 42. The current mirror 42 also includes an output or a mirror leg 53 consisting of a p-channel enhancement mode MOSFET 54 having a source electrode 56, a drain electrode 58 and a gate electrode 60. The gate electrode 60 is connected to the lead 52 and to the gate electrode 46 to receive a control potential. The source electrode 56 is connected in parallel with the source electrode 48 to the bus 20 to receive current. The amount of current flowing through the mirror leg 53 is determined by the voltage, $V_{ref}$, present at the gate electrode 38 of the MOSFET 36 and the ratio of channel width to channel length of the MOSFET 36. This temperature stabilized reference voltage, in the present embodiment, biases the MOSFET 36 to generate a drain to source current $I_{ds}$ of one hundred microamperes. The one hundred microampere current also flows through the source to drain circuit of the MOSFET 44 and is mirrored by a one microampere current drawn from the bus 20 and flowing in the source to drain circuit of the MOSFET 54. The one microampere current is not temperature compensated, but it is not essential for this current to be temperature compensated for the proper operation of this circuit.

The one microampere current flows out of the drain electrode 58 and into an n-channel enhancement mode MOSFET 62 having a drain electrode 64, a source electrode 66 and a gate electrode 68. The gate electrode 68 and the drain electrode 64 are connected together by a lead 70 so that the drain electrode 64 and the gate electrode 68 are are joined at a node 72 and biased at the same potential. The source electrode 66 is connected to the lead 34 and is biased at the potential $V_o$. The one microampere current is fed to the drain-source circuit of the n-channel MOSFET 62. Since the n-channel MOSFET 62 has a channel width to channel length ratio of approximately 50 to 3, making the MOSFET 62 a relatively large transistor, the one microampere current which flows through the low impedance drain to source circuit produces a bias potential of $V_o + V_T$ at the node 72. $V_T$ is the threshold voltage of the n-channel MOSFET 62. Thus, the MOSFET 62 is used to generate a bias potential and has added in a threshold voltage typical of the MOSFETs on the semiconductor die.

An enhancement mode n-channel MOSFET 74 having a drain electrode 76, a source electrode 78 and a gate electrode 80 is connected at its gate electrode 80 to the node 72 through a lead 81 and is biased at the potential equal to $V_o + V_T$. The source electrode 78 is connected to a bipolar diode 82. In well known n well CMOS fabrication process a vertical P-N-P device may be fabricated with a p-substrate collector, an n-well base and a p+ emitter. The bipolar diode 82 is obtained by using the emitter of such a vertical P-N-P device as the anode of the diode and the base and the collector of the vertical P-N-P device are elctrically joined together to form the cathode of the bipolar diode 82. The emitter occupies a die area of approximately 20 microns by 20 microns in order to have a low parasitic base resistance. The diode 82 exhibits a forward voltage drop $V_f$ having a negative temperature coefficient.

The MOSFET 74 is energized by a current flowing from the bus 20 through the current mirror 14, which is connected to the drain electrode 76 of the MOSFET 74. The amount of current flowing between the drain electrode 76 and the source electrode 78 is controlled both by the voltages present at the gate electrode 80 and at the source electrode 78. The gate to source voltage $V_{gs}$ can be expressed as:

$$V_{gs} = V_o + V_T - V_f$$

Since it is well known that:

$$I_{ds} \propto \mu(V_{gs} - V_T)^2$$

by substitution, the current in the MOSFET 74 drain to source circuit is:

$$I_{ds} \propto \mu(V_o - V_f)^2$$

The current $I_{ds}$ can also be defined more completely as:

$$I_{ds} = (W/2L)C_{ox}(V_o - V_f)^2 \times \mu$$

In both current equations $\mu$ is equal to the mobility of the charge carriers in the channel of the MOSFET 74. Vo is selected, in the present embodiment, to be equal to 1.25 volts in order to provide maximum cancellation for the temperature dependent influence of the charge carrier mobility. Thus, it may be appreciated that when the temperature of the circuit 10 decreases both $\mu$ and $V_f$ will increase, thereby causing $I_{ds}$ to remain substantially the same. Likewise, when the temperature of the circuit 10 increases, both $\mu$ and $V_f$ will decrease, also causing the drain to source current through the MOSFET 74 to remain the same. Therefore, the current flowing through the drain to source circuit of the MOSFET 74 is temperature compensated.

The current mirror assembly 14 includes a current sensing p-channel enhancement mode MOSFET 83 having a source electrode 84, a drain electrode 86 and a gate electrode 88. A pair of mirror p-channel enhancement mode MOSFETs, respectively numbered 90 and 92, is connected to the current sensing MOSFET 83. More particularly, the p-channel MOSFET 90 includes a source electrode 94, a drain electrode 96 and a gate electrode 98. Likewise the p-channel MOSFET 92 includes a source electrode 100, a drain electrode 102 and a gate electrode 104. All of the source electrodes 84, 94 and 100 are connected to the bus 20 to be energized thereby. All of the gate electrodes 88, 98 and 104 are connected in parallel and through a lead 106 to the drain electrode 86 of the current sensing MOSFET 83. In operation the current sensing MOSFET 83 senses the magnitude of the temperature compensated current flowing through the n-channel MOSFET 74 and causes the p-channel MOSFET 90 and the p-channel MOSFET 92 to generate linearly proportional currents. Thus, a first linearly proportional temperature compensated mirror current flows through the MOSFET 90 and is supplied to a lead 108 connected thereto. A second linearly proportional temperature compensated current flows through the MOSFET 92 and is supplied to a lead 110 connected to the drain electrode 102. This second linearly proportional temperature compensated mirror current is, in this embodiment, a capacitor charging current which is constant and substantially temperature independent.

A discharge current mirror, generally indicated by numeral 112, includes an n-channel enhancement mode current sensing MOSFET 114 having a drain electrode 116, a gate electrode 118 and a source electrode 120. The drain electrode 116 is connected to the lead 108 to receive the first temperature compensated mirror current therefrom. That current flows through the drain electrode 116, the source electrode 120 and to ground, to which the source electrode 120 is connected. A lead 122 connects the drain electrode 116 to the gate electrode 118 in a well known manner. The n-channel current sensing MOSFET 114, then, senses the current in the lead 108 and controls an n-channel enhancement mode mirror MOSFET 124, which is adapted to sink or receive a discharge current, as will become apparent hereinafter. The n-channel mirror MOSFET 124 includes a drain electrode 126, a gate electrode 128 and a source electrode 130. The source electrode 130 is connected to ground. The gate electrode 128 is connected to the gate electrode 118 of the sensing MOSFET 114 and also to the lead 122. The discharge current mirror 112 draws or sinks current at a rate which is linearly proportional to the rate of flow of the current through the drain and source electrodes 116 and 120 of the current sensing MOSFET 114. That sink current is in turn linearly proportional to the temperature compensated current which flows through the MOSFET 74. In the instant embodiment the charging current from the MOSFET 92 and the discharging current flowing through the MOSFET 124 are equal in magnitude. MOSFETs 36, 44, 54, 62, 74, 83, 90, 92, 114, and 124 all operate in the saturation region.

The Schmitt trigger oscillator 16 is connected to the lead 110 and to the drain electrode 126 of the MOSFET 124 for energization. The Schmitt trigger oscillator 16 includes a first or charging gate 130 consisting of an n-channel enhancement mode MOSFET 132 having a drain electrode 134, a gate electrode 136 and a source electrode 138. A p-channel enhancement mode MOSFET 140 is connected in parallel with the n-channel MOSFET 134 and includes a drain electrode 142, a gate electrode 144 and a source electrode 146. The source electrodes 138 and 146 are connected in parallel to the lead 110 to receive the regulated temperature compensated charging current therefrom. The drain electrodes 134 and 142 are connected to a capacitor lead 150 which is in turn connected to a capacitor lead 152. A timing capacitor 154 is connected between the capacitor lead 152 and ground. The timing capacitor 154 is an MOS capacitor implemented on the chip. The timing capacitor 154 comprises a gate of an n-channel MOSFET connected to the lead 152. A source electrode and a drain electrode of the MOSFET are both connected to ground. A CMOS Schmitt trigger inverter 156, having an input lead 158 and a output lead 160, is connected at its input lead 158 to the junction of the capacitor leads 150 and 152 to receive a potential from the capacitor 154. A first CMOS inverter 162 is connected to the output lead 160 of the inverting Schmitt trigger 156 at an input lead 164. The CMOS inverter 162 also has an output lead 166. A second CMOS inverter 168, having an input lead 170 and an output lead 172, is connected at its input lead 170 to the output lead 166 of the first CMOS inverter 162. A feedback lead 174 is connected to the output lead of the first CMOS inverter 162 and to the gate electrode 144 of the p-channel MOSFET 140.

A discharge gate 180 is connected by a lead 182 to the timing capacitor 154 and is also connected to the drain electrode 126 of the MOSFET 124 in order to sink current to ground from the timing capacitor 154. The discharge gate 180 is substantially identical to the charging gate 132 and consists of an n-channel enhancement mode MOSFET 184 having a gate 186, a source electrode 188 and a drain electrode 190. Connected in parallel with the MOSFET 184 is a p-channel enhancement mode MOSFET 192 having a gate electrode 194, a source electrode 196 and a drain electrode 198. The source electrodes 188 and 196 are connected in parallel and to the drain electrode 126 of the mirror n-channel MOSFET 124. A first output lead 200 is connected to the output terminal 172 of the second CMOS inverter 168 and to the gate electrode 136 of the n-channel MOSFET 132 to feed back the output voltage of the second CMOS inverter 168 to the gate electrode 136. A second output lead 202 is also connected to the output terminal 172 to feed back the output voltage of the second CMOS inverter 168 to the gate electrode 194 of the p-channel MOSFET 192.

In operation, constant temperature compensated current is supplied to the charging gate 130 by the current mirror assembly 14. When the voltage at the output terminal 160 of the Schmitt trigger inverter 156 is high it drives the voltage at the output terminal 166 of the CMOS inverter 162 low, thereby switching the p-channel MOSFET 140 ON and switching the n-channel MOSFET 184 OFF. At the same time the CMOS inverter 168 generates a high voltage at the leads 200 and 202, switching OFF the p-channel MOSFET 192 and switching ON the n-channel MOSFET 132. Thus, the high voltage output from the Schmitt trigger inverter 156 switches the charging gate 130 conducting and switches the discharging gate 180 non-conducting, thereby causing the constant temperature compensated current to flow into the timing capacitor 154 at a constant rate to charge it at a constant temperature independent rate. Since the two potential levels at which the Schmitt trigger inverter 156 changes state are substantially temperature independent, the Schmitt trigger inverter 156 will change state at the same voltages regardless of temperature. Once the timing capacitor 154 has charged up to the voltage at which the Schmitt trigger inverter 156 produces a low voltage output, the Schmitt trigger output 160 goes low, switching OFF the MOSFETs 132 and 140 and switching ON the discharge gate 180 to allow the timing capacitor 154 to be discharged to ground at the same rate at which it was charged. Since the discharge gate 180 is connected to the discharge current mirror 112, the current mirror 112 will maintain a constant temperature independent sink rate for the current flowing out of the timing capacitor 154, thereby providing a constant temperature independent capacitor discharge rate. When the timing capacitor 154 potential has dropped below the switching voltage of the CMOS Schmitt trigger inverter 156, the Schmitt trigger inverter 156 will again change state and the oscillatory process will be repeated. Thus, a constant period square wave voltage will be generated at the output leads 200 and 202. The constant period square wave voltage has a period which is substantially temperature independent.

Thus the integrated circuit temperature compensated CMOS oscillator 10 is energized by the $V_{DD}$ potential at the bus 20. The voltage divider 22 receives the temperature independent reference voltage $V_{ref}$ at the node 24 and produces the temperature stable attenuated voltage $V_o$ at the node 32. The n-channel MOSFET 36 is biased at its gate electrode 38 by $V_{ref}$ so that a one hundred microampere current flows in its source-drain circuit. The MOSFETs 44 and 54 mirror the current and supply a one microampere current to the n-channel MOSFET 62. The n-channel MOSFET 62 is biased by the $V_o$ potential at its source electrode 66 and produces a bias voltage equal to the sum of a threshold voltage and $V_o$. The bias voltage is fed to the gate electrode 80 of the n-channel MOSFET 74. A temperature dependent forward voltage drop of the diode 82 also biases the MOSFET 74 and compensates for temperature variations therein so that the drain-source current through the MOSFET 74 is substantially temperature independent. The drain-source current through the MOSFET 74 is mirrored by the current mirror assembly 14 to produce equal temperature independent constant charging and discharging currents. The Schmitt trigger oscillator 16 is driven by the charging and discharging currents and produces a temperature independent constant period square wave voltage which may be used as a highly accurate timing or clock signal.

It can be appreciated that a particular advantage of the present invention lies in the fact that it provides a temperature stabilized CMOS oscillator having all of its components on a single integrated circuit die. The square wave signal generated by the circuit is highly stable and may be used to generate clock signals for memories and in particular for electrically erasable programmable read only memories.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed is:

1. A temperature compensated metal-insulator-semiconductor current source fabricated as a monolithic integrated circuit on a semiconductor die, comprising: means for receiving electrical energy; means for summing a temperature stable reference voltage and a threshold voltage to produce a bias voltage; and means for biasing a metal-insulator-semiconductor field effect transistor with a difference between said bias voltage and a temperature dependent voltage across a p-n semiconductor junction to generate a substantially temperature independent current through said metal-insulator-semiconductor field effect transistor.

2. A temperature compensated metal-insulator-semiconductor current source fabricated as a monolithic integrated circuit on a semiconductor die, as defined in claim 1, wherein said means for summing includes a second metal-insulator-semiconductor field effect transistor which receives said temperature stable reference voltage and generates said threshold voltage.

3. A temperature compensated metal-insulator-semiconductor current source fabricated as a monolithic integrated circuit on a semiconductor die, as defined in claim 1, wherein said p-n semiconductor junction comprises a bipolar diode connected between a source electrode of said metal-insulator-semiconductor field effect transistor and a ground to provide a temperature dependent forward voltage drop which compensates for temperature variations in said metal-insulator-semiconductor field effect transistor.

4. A temperature compensated metal-insulator-semiconductor current source fabricated as a monolithic integrated circuit on a semiconductor die, as defined in claim 3, wherein said means for summing includes a second metal-insulator-semiconductor field effect transistor biased by said temperature stable reference voltage and being energized to produce said threshold voltage.

5. A temperature compensated complementary metal-oxide-semiconductor current source, comprising: means for summing a temperature stable reference voltage with a threshold voltage to produce a bias voltage; and an enhancement mode metal-oxide-semiconductor field effect transistor having a gate electrode receiving said bias voltage and having a source electrode connected to a p-n junction and biased thereby with a temperature dependent forward voltage in order to compensate for temperature changes in said metal-oxide-semiconductor field effect transistor whereby said metal-oxide-semiconductor field effect transistor generates a substantially temperature independent current.

6. A temperature compensated complementary metal-oxide-semiconductor current source, as defined in claim 5, wherein said means for summing includes a second metal-oxide-semiconductor field effect transistor which receives said temperature stable reference voltage and produces said threshold voltage.

7. A temperature compensated complementary metal-oxide-semiconductor current source, as defined in claim 6, wherein said second metal-oxide-semiconductor field effect transistor has a channel width of not less than ten times its channel length, said metal-oxide-semiconductor field effect transistor having a drain-source circuit energized by a small current so that said bias voltage exceeds said temperature stable reference voltage by an amount equal to said threshold voltage.

8. A temperature compensated complementary metal-oxide-semiconductor current source, comprising: means for receiving electrical energy; means for receiving a temperature stable reference voltage; means for attenuating said temperature stable reference voltage to produce a temperature stable attenuated voltage; means for adding said temperature stable attenuated voltage to a threshold voltage of a first metal-oxide-semiconductor field effect transistor to produce a first bias voltage; a second metal-oxide-semiconductor field effect transistor having a gate electrode biased by said first bias voltage and a source electrode biased by a temperature dependent forward voltage drop formed across a p-n junction whereby to generate a temperature independent current flowing through a drain electrode and said source electrode of said second metal-oxide-semiconductor field effect transistor.

9. A temperature compensated metal-oxide-semiconductor oscillator fabricated as a monolithic integrated circuit on a semiconductor die, comprising: means for receiving electrical energy; means for summing a temperature stable reference voltage and a threshold voltage to produce a bias voltage; means for biasing a metal-oxide-semiconductor field effect transistor with a difference between said bias voltage and a temperature dependent voltage across a p-n semiconductor junction to generate a current through said metal-oxide-semiconductor field effect transistor which is substantially temperature independent; and means for producing an oscillating electrical signal receiving said substantially temperature independent current to be energized thereby, whereby said oscillating electrical signal has a substantially temperature independent period.

10. A temperature compensated metal-oxide-semiconductor oscillator fabricated as a monolithic integrated circuit on a semiconductor die, as defined in claim 9, wherein said means for summing includes a second metal-oxide-semiconductor field effect transistor receiving said temperature stable reference voltage at a source electrode thereof and producing a voltage at a drain electrode thereof which exceeds the source voltage by an amount substantially equal to said threshold voltage.

11. A temperature compensated metal-oxide-semiconductor oscillator fabricated as a monolithic integrated circuit on a semiconductor die, as defined in claim 10, wherein said p-n semiconductor junction comprises a bipolar diode connected between a source of ground potential and a source electrode of said first metal-oxide-semiconductor field effect transistor.

12. A temperature compensated complementary metal-oxide-semiconductor oscillator, comprising: means for summing a temperature stable reference voltage with a threshold voltage to produce a bias voltage; an enhancement mode metal-oxide-semiconductor field effect transistor having a gate electrode receiving said bias voltage and having a source electrode connected to a p-n junction to be biased thereby with a temperature dependent voltage to generate a current which is substantially temperature independent; and means for producing an oscillating electrical signal being energized by said substantially independent current whereby said oscillating electrical signal has a period which is substantially temperature independent.

13. A temperature compensated complementary metal-oxide-semiconductor oscillator, as defined in claim 12, wherein said means for summing comprises a second metal-oxide-semiconductor field effect transistor receiving said temperature stable reference voltage at a source electrode thereof and being energized by a current of less than two microamperes whereby said bias voltage is produced at a drain electrode of said second metal-oxide-semiconductor field effect transistor.

14. A temperature compensated complementary metal-oxide-semiconductor oscillator, as defined in claim 13, wherein said second metal-oxide-semiconductor field effect transistor has a channel width not less than ten times its channel length.

15. A temperature compensated complementary metal-oxide-semiconductor oscillator, comprising: means for receiving electrical energy; means for receiving a temperature stable reference voltage; means for attenuating said temperature stable reference voltage to produce a temperature stable attenuated voltage; means for adding said temperature stable attenuated voltage to a threshold voltage of a first metal-oxide-semiconductor field effect transistor to produce a first bias voltage; a second metal-oxide-semiconductor field effect transistor having a gate electrode biased by said first bias voltage and a source electrode biased by a temperature dependent forward voltage drop across a p-n junction whereby to generate a temperature independent current flowing through a drain electrode and said source electrode of said second metal-oxide-semiconductor field effect transistor; and means for producing an oscillating electrical signal being energized by said temperature independent current so that a period of said oscillating electric signal is substantially temperature independent.

16. A temperature compensated complementary metal-oxide-semiconductor oscillator, as defined in claim 15, wherein said p-n junction comprises a bipolar diode connected to a source of ground potential and connected to said source electrode of said second metal-oxide-semiconductor field effect transistor so that said temperature dependent forward voltage drop compensates for a temperature dependent change in said second metal-oxide-semiconductor field effect transistor.

17. A temperature compensated complementary metal-oxide-semiconductor oscillator, as defined in claim 15, wherein said means for producing an oscillating electric signal comprises a capacitor adapted to be charged by said temperature independent current and a Schmitt trigger connected to said capacitor for providing an oscillator output signal.

18. A temperature stable complementary metal-oxide-semiconductor oscillator for use as a clock, comprising: a voltage divider receiving a temperature stable reference voltage from a source of temperature stable reference voltage and producing a temperature stable attenuated voltage; a first metal-oxide-semiconductor field effect transistor connected to said voltage divider to receive said temperature stable reference voltage at a gate electrode thereof to control a magnitude of a first current flowing between a first drain electrode thereof and a first source electrode thereof; a first current mirror connected to said first metal-oxide-semiconductor field effect transistor and having said first current flowing therethrough, said first current mirror producing a second current proportional to said frist current; a second metal-oxide-semiconductor field effect transistor having a second gate electrode, a second source electrode and a second drain electrode, said second gate electrode and said second drain electrode of said second metal-oxide-semiconductor field effect transistor being connected together and receiving said second current, said second source electrode being connected to said voltage divider to receive said temperature stable attenuated voltage, said second metal-oxide-semiconductor field effect transistor developing a bias potential at a junction of said second gate electrode and said second drain electrode equal to a sum of said temperature stable attenuated voltage and a threshold voltage; a third metal-oxide-semiconductor field effect transistor having a third gate electrode, a third drain electrode and a third source electrode and being connected at said third gate electrode to said junction and receiving said bias voltage, said drain electrode being coupled to a source of current; a p-n junction bipolar diode connected to said third source electrode to bias said third source electrode with a temperature dependent forward voltage across said bipolar diode to compensate for a temperature dependent variation in a characteristic of said third metal-oxide-semiconductor field effect transistor, said third metal-oxide-semiconductor field effect transistor being thereby biased to produce a drain to source current which is substantially temperature independent; and a Schmitt trigger oscillator receiving said constant temperature independent current and being driven thereby so that said Schmitt trigger oscillator has a constant temperature independent period.

19. A temperature stable complementary metal-oxide-semiconductor oscillator for use as a clock, as defined in claim 18, wherein each of said metal-oxide-semiconductor field effect transistors is an enhancement mode metal-oxide-semiconductor field effect transistor.

* * * * *